United States Patent [19]
Nelson

[11] Patent Number: 4,543,153
[45] Date of Patent: Sep. 24, 1985

[54] PROCESS AND APPARATUS FOR ETCHING COPPER MASKED BY A NICKEL-GOLD MASK

[75] Inventor: Norvell J. Nelson, Palo Alto, Calif.

[73] Assignee: PSI Star, Hayward, Calif.

[21] Appl. No.: 611,190

[22] Filed: May 17, 1984

[51] Int. Cl.$^4$ .......................... C23F 1/02; B44C 1/22; C03C 15/00; C03C 25/06
[52] U.S. Cl. .................. 156/656; 156/659.1; 156/666; 156/902; 156/904; 156/345; 204/129.65; 252/79.2
[58] Field of Search .............. 156/656, 659.1, 664, 156/666, 634, 345, 901, 902, 904; 204/129.1, 129.65; 252/79.2; 430/313, 318; 134/3, 41

[56] References Cited

U.S. PATENT DOCUMENTS

| | | | |
|---|---|---|---|
| 3,287,191 | 11/1966 | Borth | 156/656 X |
| 3,905,883 | 9/1975 | Hanazono et al. | 204/129.65 |
| 4,045,312 | 8/1977 | Satoshi | 204/129.65 |
| 4,075,757 | 2/1978 | Malm et al. | 156/656 |

Primary Examiner—William A. Powell
Attorney, Agent, or Firm—Flehr, Hohbach, Test, Albritton & Herbert

[57] ABSTRACT

Process and apparatus for anisotropically etching copper through a nickel-gold mask on a circuit board. An electrical connection is made between the copper and the reactor wall or another electrical conductor contacted by the etching solution. The copper is removed anisotropically, without undercutting or lateral etching of the copper beneath the nickel-gold mask.

12 Claims, 2 Drawing Figures

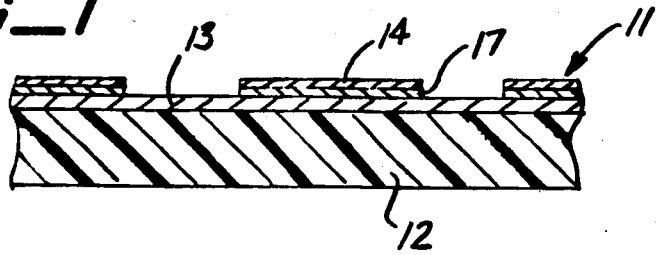
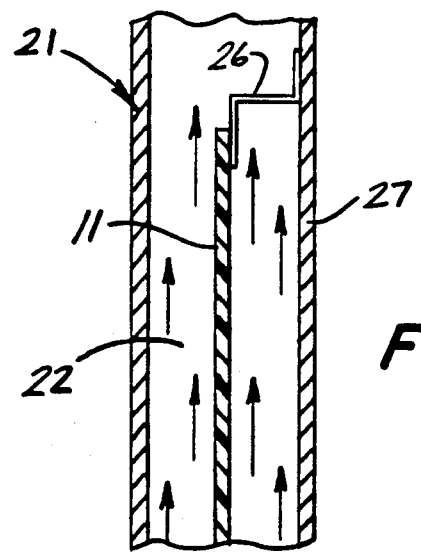

PROCESS AND APPARATUS FOR ETCHING COPPER MASKED BY A NICKEL-GOLD MASK

This invention pertains generally to the manufacture of printed circuit boards and more particularly to a process and apparatus for anisotropically etching copper through a nickel-gold mask on a circuit board.

In one method of manufacturing corrosion resistant circuit boards, a photoresist pattern is formed on the outer surface of the copper layer, with the portions of the copper to be preserved being exposed through the resist. A layer of gold is formed on the exposed portions of the copper, with a layer of nickel being interposed between the copper and the gold to prevent diffusion of the gold into the copper. The photoresist is removed, and the newly exposed portions of the copper are etched away, with the gold serving as a mask during the etching process.

As the exposed portions of the copper are etched away, an undesired undercutting or removal of the copper beneath the nickel-gold mask occurs with every prior etching technique known to applicant. Somewhat surprisingly, it has been found that this undercutting can be almost entirely eliminated by connecting the copper electrically to the reactor wall or to any other electrical conductor which is contacted by the etchant.

It is in general an object of the invention to provide a new and improved process for etching copper through a nickel-gold mask on a circuit board.

Another object of the invention is to provide a process and apparatus of the above character which produce an anisotropic etch with substantially no undercutting of the copper beneath the nickel-gold mask.

These and other objects are achieved in accordance with the invention by making an electrical contact between the copper on the circuit board and the reactor wall or other electrical conductor contacted by the etching solution. With this connection, the copper being removed and the other conductor are maintained at substantially the same electrical potential, and it has been found, somewhat surprisingly, that the etching reaction becomes anisotropic without significant undercutting of the copper beneath the nickel-gold mask.

FIG. 1 is a fragmentary sectional view of a circuit board with a nickel-gold mask to be etched in accordance with the invention.

FIG. 2 is a fragmentary sectional view, somewhat schematic, of one embodiment of apparatus for etching copper in accordance with the invention.

In the drawings, the invention is illustrated in connection with a printed circuit board 11 having an insulative substrate 12 and a layer of copper 13 on one side of the substrate. A nickel-gold mask comprising a layer of nickel 14 and a layer of gold 17 is formed on the outer surface of the copper over the portions of the copper to be retained. The mask can be formed by any suitable technique such as by coating the entire surface of the copper with a layer of photoresist, removing the photoresist where the copper is to be retained, plating the board with nickel and gold which adhere only where the photoresist has been removed, then removing the remainder of the photoresist.

The exposed copper is removed by exposing the board to an etching solution. Any suitable etching solution can be employed, and one preferred solution is described in, now U.S. Pat. No. 4,497,687. This solution comprises an aqueous solution of $NO_2$ or $HNO_3$, a dissolved copper salt such as $Cu(NO_3)_2$, and a polymer additive which serves as a surfactant and as an inhibitor of lateral etching or undercutting. This etching solution and its use are described in greater detail in the aforementioned patent.

The etching reaction can be carried out in any suitable reactor, and in the embodiment illustrated in FIG. 2 the circuit board 11 is illustrated as being etched in a reactor 21 having a flow channel 22 in which the board is placed. The etching solution flows through the channel, and the flow rate can be adjusted to optimize the removal of copper. A reactor of this type, is described in detail in, now U.S. Pat. No. 4,482,425.

An electrically conductive wire 26 is connected between the copper on the circuit board and the electrically conductive metal wall 27 of the reactor to maintain the copper and the wall at substantially the same electrical potential. A similar connection is made between the board and any other electrical conductor (not shown) which may be contacted by the etching solution with the copper. Somewhat surprisingly, this connection has been found to be very effective in eliminating lateral etching or undercutting of the copper beneath the nickel-gold mask. The reason for this result is not fully understood, but it is believed to be due at least in part to the elimination of a voltaic effect between the copper and the other conductor.

When the copper is etched, it enters the etching solution as $Cu^{++}$. If the solution deviates very far from electrical neutrality, very large electrostatic forces are created and bring the solution back to neutrality. In order for this to occur, anions must be present to neutralize the positive charge of the copper cations. The copper cations and anions diffuse away from the circuit board when they are in high concentrations, and if they do not have the same diffusion coefficient, there will be sufficient charge separation to set up an electrical field of sufficient magnitude and direction to make the negative and positive charges move together. A voltage then exists between the board and the interior of the etching solution, with no net current. A similar effect takes place at the reactor wall or other electrical conductor, and a difference in voltage is created between the board and the wall or other conductor. When this occurs, undercutting of the copper occurs.

When an external electrical connection is made between the copper board and the reactor wall or other conductor, an electron current can flow between the two, and there can be no electrical potential difference. When the $Cu^{++}$ goes into solution, it is neutralized by a shifting of the whole negative charge distribution and the appearance at the reactor wall or other conductor of two electrons which have flowed from the copper board through the wire. It may also be that the $Cu^{++}$ is neutralized by a negative surfactant which then attaches itself to the wall of the cut.

It is apparent from the foregoing that a new and improved process and apparatus for etching copper have been provided. While only certain presently preferred embodiments have been described in detail, as will be apparent to those familiar with the art, certain changes and modifications can be made without departing from the scope of the invention as defined by the following claims.

I claim:

1. In a process for etching copper on a circuit board in the presence of another electrical conductor, the steps of: forming a metallic mask over portions of the copper to be retained, connecting the copper electrically to the other conductor, and contacting the exposed portions of the copper and the other conductor with a liquid etchant to effect removal of the copper.

2. The process of claim 1 wherein the copper is contacted with the etchant in a reaction chamber having an electrically conductive metal wall, and the copper is connected electrically to the metal wall.

3. The process of claim 1 wherein the etchant comprises an aqueous solution of $NO_2$ or $HNO_3$, $Cu(NO_3)_2$, and a polymer additive.

4. The process of claim 1 wherein the metallic mask is formed by forming a layer of nickel over the copper and forming a layer of gold over the nickel.

5. In apparatus for removing copper from a circuit board in the presence of another electrical conductor, with a metallic mask covering portions of the copper to be retained: means for connecting the copper electrically to the other conductor to maintain the copper and the other conductor at substantially the same electrical potential, and means for contacting the exposed portions of the copper and the other conductor with a liquid etchant to effect removal of the copper.

6. The apparatus of claim 5 including a reaction chamber having an electrically conductive wall, and means for connecting the copper to the reactor wall.

7. The apparatus of claim 6 wherein the means for connecting the copper to the reactor wall comprises an electrically conductive wire.

8. The apparatus of claim 5 wherein the etchant comprises an aqueous solution of $NO_2$ or $HNO_3$, $Cu(NO_3)_2$, and a polymer additive.

9. In combination: a circuit board having a layer of electrically conductive copper on one side thereof, a nickel-gold mask covering portions of the copper, another electrical conductor in proximity to the circuit board, a liquid etchant contacting the exposed portions of the copper and the other conductor, and means connecting the copper and the other conductor electrically together to maintain the copper and the other conductor at substantially the same electrical potential.

10. The combination of claim 9 wherein the other conductor comprises a metal wall of a reactor.

11. The combination of claim 9 wherein the means connecting the copper and the other conductor together comprises an electrically conductive wire.

12. The combination of claim 9 wherein the etchant comprises an aqueous solution of $NO_2$ or $HNO_3$, $Cu(NO_3)_2$, and a polymer additive.

* * * * *